United States Patent [19]

Presting et al.

[11] Patent Number: 6,043,517
[45] Date of Patent: Mar. 28, 2000

[54] SIGE PHOTODETECTOR WITH HIGH EFFICIENCY

[75] Inventors: Hartmut Presting, Blaustein; Ulf König; Andreas Gruhle, both of Ulm, all of Germany

[73] Assignee: Daimler-Benz AG, Stuttgart, Germany

[21] Appl. No.: 09/055,318

[22] Filed: Apr. 6, 1998

[30] Foreign Application Priority Data

Apr. 5, 1997 [DE] Germany ............... 197 14 054

[51] Int. Cl.$^7$ ............... H01L 31/0328; H01L 31/0336; H01L 31/072; H01L 31/109
[52] U.S. Cl. ............... 257/184; 257/19; 257/21; 257/22; 257/440; 257/457; 372/43; 372/45
[58] Field of Search ............... 257/18, 19, 21, 257/22, 184, 440, 457; 372/43, 45

[56] References Cited

U.S. PATENT DOCUMENTS 4,959,694   9/1990   Gell.
5,942,789   8/1999   Morikawa ............... 257/457

FOREIGN PATENT DOCUMENTS 0 540 235 A2   5/1993   European Pat. Off..

OTHER PUBLICATIONS

Karunasiri, R.P.G., Park, J.S.; Wang, K.L.: Normal incidence infrared detector using intervalence–subband transitions in $Si_{1-x}Ge_x$/Si quantum wells, In: Appl. Phys. Lett. 61(20), 16. Nov. 1992, S. 2434–2436.

Huang, F.Y., et al.: Normal–incidence strained–layer superlattice $Ge_{0.5}Si_{0.5}$/Si photodiodes near 1.3 μm. In: Appl. Phys. Lett. 67(4), 24. Jul. 1995, S.566–568.

Misra, R., Greve, D.W., Schlesinger, T.E.: Infrared absorption in $Ge_xSi_{1-x}$ quantum wells. In: Appl. Phys. Lett. 67(17), 23. Oct. 1995, S. 2548–2550.

Edelman, F., et al.: Fast interfacial oxidation of amorphous $Si_{1-x}Ge_x$:H by $SnO_2$. In: Appl. Phys. Lett. 57(3), 17. Jul. 1995, S.389–391.

*Primary Examiner*—Ngân V. Ngô
*Attorney, Agent, or Firm*—Venable; George H. Spencer; Norman H. Kunitz

[57] ABSTRACT

A photodetector which can be operated in two wavelength ranges and is comprised of two detectors (A, B) arranged one on top of the other. A Si Schottky diode forms detector A which absorbs light in a region λ<0.9 μm. Longer-waved light (1 μm<λ<2 μm) is absorbed in detector B which is comprised of an Si/SiGe pn-diode. To increase the efficiency, detector B is made with an integrated resonator. A further increase of the efficiency of the photodetector is accomplished through the mounting of a Bragg reflector on the absorbing layer of detector B.

19 Claims, 1 Drawing Sheet

SIGE PHOTODETECTOR WITH HIGH EFFICIENCY

REFERENCE TO RELATED APPLICATIONS

This application claims the priority of German Application Serial No. 197 14 0548 filed Apr. 5, 1997, which is incorporated herein by reference.

BACKGROUND OF THE INVENTION

The invention relates to a photodetector which can be operated n at least two wavelength ranges and a method of making the same. The invention is used for photovoltaic detectors and solar cells.

Photodetectors operating in the two-wavelength mode have been disclosed for III/V compound semiconductor materials (Friedmann et al. in Compound Semiconductor, page 27, November/December 1996). Photodetectors of this type have a relatively low efficiency. Moreover, the spectral sensitivity is merely determined by a single semiconductor material.

Therefore, it is the object of the present invention to provide a photodetector with high efficiency which can be operated at least in two wavelength ranges.

SUMMARY OF THE INVENTION

The above object generally is achieved according to a first aspect of the invention by a photodetector, which can be operated in at least two wavelength ranges, and which comprises a semiconductor body comprised of Si and SiGe semiconductor material layers, with the semiconductor body including at least first and second photodetectors arranged one on top of the other and responsive to different respective wavelength ranges.

The invention has the advantage that two detectors with different respective wavelength ranges are arranged one on top of the other and a higher efficiency is generated by adding the photocurrents. In this case, the first detector is comprised of a Schottky diode on a lightly doped silicon substrate and the second detector is comprised of an Si/SiGe pn-diode. Because of the light incident on the first detector, photons with shorter wavelengths (e.g., $\lambda < 0.9 \, \mu m$) generate electron-hole pairs in the depletion region of the Schottky diode, which are transported to the contacts while the voltage is applied, and which cause an electronic current flow. Longer-waved photons (e.g., $1 \, \mu m < \lambda < 2 \, \mu m$) are absorbed by the second detector after having passed through the first detector. Here, the absorption layer can be realized by a suitable SiGe multilayer structure, e.g., a multiply stacked Si/SiGe quantum well structure, or a short-periodic SiGe superlattice. The absorption mechanisms and the operating mode of the above-cited detectors are disclosed in articles by H. Presting et al., Applied Physics Letters 69, p. 2376 (1996) and Applied Physics Letters 63, p. 491 (1993). For a broadband incident spectrum, e.g., when a solar cell is used, photons of different wavelengths generate the two individual photon flows $I_A$ and $I_B$ in both detectors, which two photon flows add up to form one overall photon flow I. For reasons of impedance matching, the individual photon flows must be of the same magnitude. The absorption coefficient of the epitaxially grown SiGe layer should therefore be larger by approximately two magnitudes than the absorption coefficient of the silicon substrate.

It is a further advantage of the invention that the second detector is configured to have an integrated resonator which increases the efficiency of the second detector.

Furthermore, it is advantageous that, for the reflection light passing through both detectors, a Si/SiGe Bragg reflector is applied on the absorbing multilayer structure of the second detector, which Bragg detector again increases the efficiency of the overall detector.

According to a further aspect of the invention, a method of making a photodetector of the type discussed above comprises the steps of:

providing a lightly p-doped Si substrate;

epitaxially growing a semiconductor layer sequence on a first major surface of the substrate, with the layer sequence including a p-doped Si layer having a doping concentration of $10^{13} \, cm^{-3}$ and a layer thickness of 100 nm, an undoped or lightly p-doped multilayer structure, configured as Ge/Si/Ge quantum well potential structure with a layer thickness of 200 nm, and an n-doped Si layer having a doping concentration of $10^{18}$ to $10^{19}$ $cm^{-3}$ and a layer thickness of 100 nm;

structuring the multilayer structure and the n-doped Si layer to form a mesa on a surface of the p-doped Si layer; applying a metal Schottky contact to a major surface of the substrate opposite the first major surface; and, applying respective ohmic metal contacts on an outer surface of the p-doped Si layer and on the n-doped Si layer to form a first detector as a Schottky diode in the substrate and a second defects as a SiGe pn-diode.

According to a further embodiment of the method according to the invention, a photodetector of the type mentioned above if produced according to the steps of:

providing a lightly p-doped Si substrate;

epitaxially growing a semiconductor layer sequence on a first major surface of the substrate, with the layer sequence including a p-doped SiGe layer having a doping concentration of $10^{17} \, cm^{-3}$ and a layer thickness of 1000 nm, an undoped or lightly p-doped multilayer structure, configured as a SiGe superlattice with a layer thickness of 100 nm, and a n-doped Si layer having a doping concentration of $10^{18}$ to $10^{19} \, cm^{-3}$ and a layer thickness of 100 nm;

structuring the multilayer structure and the n-doped si layer to form a mesa on a surface of the p-doped SiGe layer;

applying a metal Schottky contact to a major outer surface of the substrate opposite the first major surface; and, applying respective ohmic metal contacts on the surface of the p-doped SiGe layer and on the n-doped Si layer to form a first detector as a Schottky diode in the substrate and a second detector as a SiGe pn-diode.

The invention is explained in greater detail by way of embodiments with reference to schematic drawings.

DETAILED DESCRIPTION OF THE PREFERRED EMBODIMENTS

Figure 1:
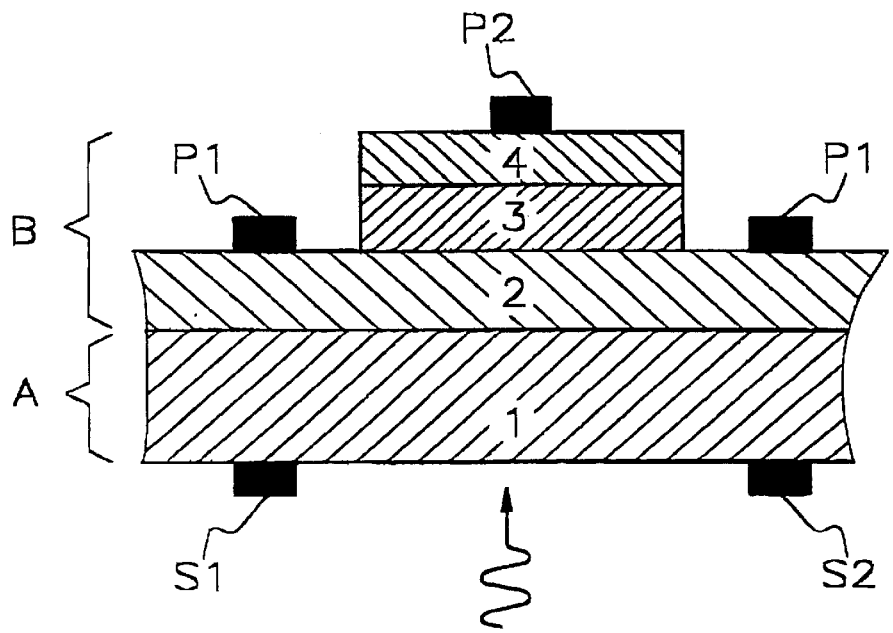
FIG. 1 is a schematic diagram of a dual detector photodetector according to a first embodiment of the invention.

In a first embodiment according to FIG. 1, a semiconductor layer sequence comprised of layer 2–4 is epitaxially grown, e.g., by means of molecular beam epitaxy, on a major surface of a Si 1 substrate, e.g., on a <100>-Si substrate, which is polished on both sides and which is lightly p-doped, and which has a doping concentration of $10^{15}$ cm$^{-3}$ and a specific resistance of 50 Ωcm.

The layer 2 is a p-doped layer made from Si having a doping concentration of $10^{17}$ cm$^{-3}$ of e.g., boron atoms, and a layer thickness of 100 nm. The layer 3 is an undoped or lightly p-doped multilayer structure 3, which is configured as a Ge/Si/Ge quantum well potential structure, with a layer thickness of 200 nm and a doping concentration of $10^{16}$ cm$^{-3}$ of, e.g., boron atoms. Finally the layer 4 is an n-doped layer 4 made from Si having a doping concentration of $10^{18}$ to $10^{19}$ cm$^{-3}$ of, e.g., Sb atoms, and a layer thickness of 100 nm.

By means of standard semiconductor process techniques, a mesa patterning out of the layers on top of the outer major surface of layer 2, i.e., the layers 3 and 4, and metallization for the contacts of the diodes which are to be produced are carried out. The Schottky contacts S1, S2 made from, e.g., aluminum, are applied on the back side, of the substrate layer 1, i.e., the outer major surface of the substrate, so that the substrate 1 forms the Si Schottky diode of the first detector A. The Si/SiGe pn-diode is made from the layers 2, 3, 4 of the Si/SiGe layer sequence and forms the second detector B. The bottom ohmic contact P1, is applied on the outer major surface of the p-doped Si layer 2 and the top ohmic contact P2 on the outer surface of the n-doped Si layer 4. The p-doped layer 2 forms the bottom contact layer of the Si/SiGe pn-diode B and simultaneously acts as the resonator of the second detector B.

Because of the selection of a suitable Ge/Si/Ge quantum well potential structure as an absorbing layer of the second detector B, a peak wavelength of, e.g., 1.3 μm can be set.

In a second embodiment, the p-doped layer 2 of the semiconductor layer sequence according to FIG. 1 is grown as a SiGe buffer layer for a SiGe superlattice structure as the absorbing layer or multilayer structure 3 of the second detector B. The p-doped $Si_{1-x}Ge_x$ layer 2, for example, with a mean Ge content of x=0.25, has a doping concentration of $10^{17}$ boron atoms per cm$^3$ and a layer thickness of 1000 nm. On top of the SiGe buffer layer 2, a multilayer structure 3 is grown which is configured as a SiGe superlattice and which is comprised of an alternating layer sequence of, e.g., 5, monolayers of Si and Ge, each having an overall layer thickness of approximately 200 nm. The Ge content of the buffer layer 2 corresponds to the mean Ge content of the SiGe superlattice and, in this case, x=0.5. The SiGe buffer layer 2 forms the bottom contact layer of the Si/SiGe pn-diode B and simultaneously acts as a resonator of the second detector B. When short-periodic SiGe superlattice layers are selected as the absorption layer 3 for detector B, a SiGe buffer layer 2 is first grown on the silicon substrate 1 for stress relaxation. Due to the refractive index jump between the SiGe layer 2 and the silicon substrate 1, this layer acts as a Fabry-Perot resonator for detector B if the layer thickness is selected appropriately. This resonator increases the efficiency and changes the absorption maximum (peak wavelength) of detector B. Here, the layer thickness of the SiGe buffer layer 2 is linked with the peak wavelength of the absorption by way of the Fabry-Perot relationship. A resonator of this type is disclosed for silicon detectors in an article by S. Murtaza et al., Proc. of 52$^{nd}$ Annual Device Research Conf., p. IV A-3, University of Colorado, Boulder (1994). Because of the selection of the SiGe superlattice as the absorbing layer 3 of the second detector B, a peak wavelength of, e.g., 1.55 μm is set.

Figure 2:
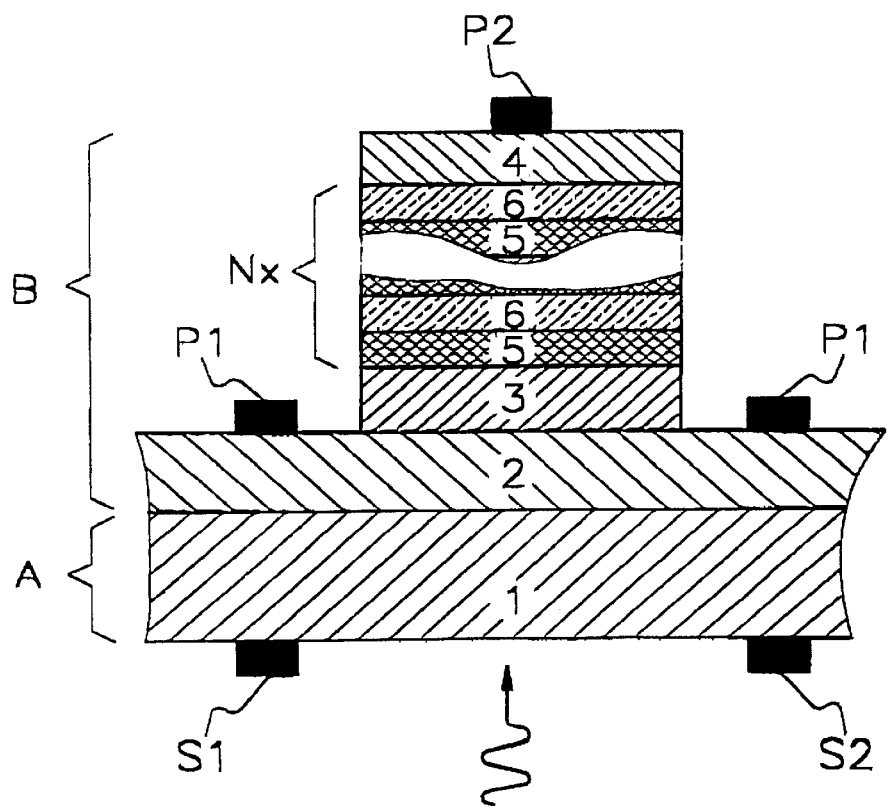
FIG. 2 is a schematic diagram of a dual detector photodetector according to a further embodiment of the invention.

In a third embodiment as shown in FIG. 2, an Si/SiGe Bragg reflector 5 is additionally grown on the SiGe multi-layer structure 3 for the reflection of the light which was not absorbed by either of the two detectors A or B. The Bragg reflector is comprised of, e.g., an N-fold grown periodic layer sequence of n-doped Si and SiGe layers 5, 6, respectively. A Si/SiGe Bragg reflector of this type is described in the publication by R. Kuchibhotla et al., Applied Physics Letters, 62, p. 2215 (1993). In the present embodiment, the Bragg reflector is grown from, e.g., an N=10-fold grown layer sequence comprised of Si layers 5 having a thickness of approximately 100 nm and $Si_{1-y}Ge_y$ layers 6 of equal thickness with a Ge content of $0.2 \geq y \geq 0.4$ and an n-doping of $10^{18}$ to $10^{19}$ cm$^{-3}$. The reflection of the light takes place at the SiGe layer of the covering layer of the Bragg reflector. The peak reflection of the reflector is set to the peak absorption of the detector through a precise selection of the SiGe composition. The additional mounting of a Bragg reflector accomplishes a further increase of the efficiency of detector B.

The invention now being fully described, it will be apparent to one of ordinary skill in the art that many changes and modifications can be made thereto without departing from the spirit or scope of the invention as set forth herein.

What is claimed:

1. A photodetector, which can be operated in at least two wavelength ranges, comprising a semiconductor body comprised of Si and SiGe semiconductor material layer, with the semiconductor body including at least first and second photodetectors arranged one on top of the other and responsive to different respective wavelength ranges.

2. A photodetector according to claim 1, wherein the first detector is a Schottky diode on a Si substrate.

3. A photodetector according to claim 1, wherein the second detector is a Si/SiGe pn-diode.

4. A photodetector according to claim 3, wherein the second detector is a Si/SiGe pn-diode with an integrated resonator.

5. A photodetector according to claim 1, wherein the second detector is a Si/SiGe pn-diode with an integrated resonator.

6. A photodetector according to claim 5, wherein a Bragg reflector is integrated into the layer sequence over the Si/SiGe pn-diode.

7. A photodetector according to claim 3, wherein the active detector layer of the Si/SiGe pn-diode is a SiGe multilayer.

8. A photodetector according to claim 7, wherein the SiGe multilayer structure is configured as a Ge/SiGe quantum well potential structure.

9. A photodetector according to claim 8, wherein the Ge/SiGe quantum well potential structure is grown on an Si layer which forms both an integrated resonator for the second detector and a contact layer for the second detector.

10. A photodetector according to claim 7, wherein the SiGe multilayer structure is configured as a SiGe superlattice.

11. A photodetector according to claim 10, wherein the SiGe superlattice is grown on a SiGe buffer layer which simultaneously forms a resonator for the second detector and a contact layer for the second detector.

12. A photodetector according to claim 1 wherein the semiconductor body comprises a p-doped Si substrate having a semiconductor layer sequence epitaxially grown on a first major surface of said substrate and comprised of a p-doped Si layer having a doping concentration of $10^{17}$ cm$^{-3}$ and a layer thickness of 100 nm, an undoped or lightly p-doped multilayer structure, configured as a Ge/Si/Ge quantum well potential structure with a layer thickness of 200 nm, and an n-doped Si layer having a doping concentration of $10^{18}$ to $10^{19}$ cm$^{-3}$ and a layer thickness of 100 nm; and further comprising:
  metal Schottky contacts disposed on an outer major surface of the said substrate opposite said first major surface;
  an ohmic metal contact on the p-doped Si layer; and,
  an ohmic metal contact on said n-doped Si layer, whereby said substrate and said Schottky contact form a Schottky diode first detector operating in a first wavelength range, and said p-doped Si layer, said multilayer structure and said n-doped Si layer form a SiGe pn-diode second detector operating in a different wavelength range.

13. A photodetector according to claim 12, further including a Bragg reflector, comprised of an N-fold grown periodic layer sequence from n-doped Si and SiGe layers, disposed between the SiGe multilayer structure and the n-doped Si layer.

14. A photodetector according to claim 1 wherein the semiconductor body comprises a lightly p-doped Si substrate having a semiconductor layer sequence epitaxially grown on a first major surface of said substrate and comprised of
  a p-doped SiGe layer having a doping concentration of $10^{17}$ cm$^{-3}$ and a layer thickness of 1000 nm,
  an undoped or lightly p-doped multilayer structure configured as a SiGe superlattice with a layer thickness of 200 nm, and
  an n-doped Si layer having a doping concentration of $10^{18}$ to $10^{19}$ cm$^{-3}$ and a layer thickness of approximately 100 nm; and further comprising:
  a metal Schottky contact disposed on an outer major surface of said substrate opposite said first major surface;
  a first ohmic contact on the p-doped SiGe layer; and
  a second ohmic contact on the n-doped Si layer, whereby the Schottky contact and the substrate form a Schottky diode first detector operating in a first wavelength range, and the p-doped SiGe layer, the multilayer structure and the n-doped Si layer form a SiGe pn-diode second detector operating in a second wavelength range.

15. A photodetector according to claim 14, further including a Bragg reflector, comprised of an N-fold grown periodic layer sequence from n-doped Si and SiGe layers, disposed between the SiGe multilayer structure and the n-doped Si layer.

16. A method of making a photodetector according to claim 1 comprising the steps of:
  providing a lightly p-doped Si substrate;
  epitaxially growing a semiconductor layer sequence on a first major surface of the substrate, with the layer sequence including
    a p-doped Si layer having a doping concentration of $10^{13}$ cm$^{-3}$ and a layer thickness of 100 nm,
    an undoped or lightly p-doped multilayer structure, configured as a Ge/Si/Ge quantum well potential structure with a layer thickness of 200 nm, and
    an n-doped Si layer having a doping concentration of $10^{18}$ to $10^{19}$ cm$^{-3}$ and a layer thickness of 100 nm;
  structuring the multilayer structure and the n-doped Si layer to form a mesa on a surface of the p-doped Si layer;
  applying a metal Schottky contact to a major surface of the substrate opposite the first major surface; and,
  applying respective ohmic metal contacts on the surface of the p-doped Si layer and on an outer surface of the n-doped Si layer to form a Schottky diode first detector in said substrate and a SiGe pn-diode second detector.

17. A method of making a photodetector according to claim 16 further comprising epitaxially growing a Bragg reflector structure, including an N-fold periodic layer sequence of n-doped Si and SiGe layers, on the multilayer structure and thereafter growing the n-doped si layer on the layers of the Bragg reflector prior to said step of structuring.

18. A method of making a photodetector according to claim 1 comprising the steps of:
  providing a lightly p-doped Si substrate;
  epitaxially growing a semiconductor layer sequence on a first major surface of the substrate, with the layer sequence including
    a p-doped SiGe layer having a doping concentration of $10^{17}$ cm$^{-3}$ and a layer thickness of 1000 nm,
    an undoped or lightly p-doped multilayer structure, configured as a SiGe superlattice with a layer thickness of 100 nm,
    and an n-doped Si layer having a doping concentration of $10^{18}$ to $10^{19}$ cm$^{-3}$ and a layer thickness of 100 nm;
  structuring the multilayer structure and the n-doped si layer to form a mesa on a surface of the p-doped SiGe layer;
  applying a metal Schottky contact to a major outer surface of the substrate opposite the first major surface; and applying respective ohmic metal contacts on the surface of the p-doped SiGe layer and on the n-doped Si layer to form a first detector as a Schottky diode in the substrate and a second detector as a SiGe pn-diode.

19. A method of making a photodetector according to claim 18 further comprising epitaxially growing a Bragg reflector structure, including an N-fold periodic layer sequence of n-doped Si and SiGe layers, on the SiGe multilayer structure and thereafter growing the n-doped Si layer on the layers of the Bragg reflector prior to said step of structuring.

* * * * *